US008587323B2

(12) United States Patent  
Fichtlscherer et al.

(10) Patent No.: US 8,587,323 B2
(45) Date of Patent: Nov. 19, 2013

(54) METHOD FOR DIAGNOSING AN ELECTRICAL CONNECTION, AND OUTPUT ASSEMBLY

(75) Inventors: Martin Fichtlscherer, Amberg (DE); Tobias Gramolla, Kümmersbruck (DE); Mario Maier, Ensdorf (DE)

(73) Assignee: Siemens Aktiengesellschaft, Munich (DE)

( * ) Notice: Subject to any disclaimer, the term of this patent is extended or adjusted under 35 U.S.C. 154(b) by 365 days.

(21) Appl. No.: 13/012,922

(22) Filed: Jan. 25, 2011

(65) Prior Publication Data

US 2011/0181293 A1    Jul. 28, 2011

(30) Foreign Application Priority Data

Jan. 25, 2010 (EP) ..................................... 10151531

(51) Int. Cl.
*G01R 31/00* (2006.01)
*H04B 3/46* (2006.01)

(52) U.S. Cl.
USPC ............................. 324/537; 324/500; 324/543

(58) Field of Classification Search
USPC ........................... 324/537, 538, 539, 543, 500
See application file for complete search history.

(56) References Cited

U.S. PATENT DOCUMENTS

| 5,548,463 | A | * | 8/1996 | Aldridge et al. ................ 361/18 |
| 6,420,877 | B1 |   | 7/2002 | Replogle |
| 7,298,167 | B1 |   | 11/2007 | Dorr et al. |
| 2003/0030447 | A1 |   | 2/2003 | Masaoka |
| 2005/0083066 | A1 |   | 4/2005 | Abe et al. |

FOREIGN PATENT DOCUMENTS

| DE | 10 2006 004 481 A1 |   | 8/2007 |
| GB | 2 318 935 A |   | 5/1998 |
| GB | 2389471 A | * | 6/2002 |
| GB | 2 389 471 A |   | 12/2003 |

\* cited by examiner

*Primary Examiner* — Jermele M Hollington
*Assistant Examiner* — Farhana Hoque
(74) *Attorney, Agent, or Firm* — Cozen O'Connor

(57) ABSTRACT

A output assembly and method for diagnosing an electrical connection for reliably identifying a possible wire break to a load in redundantly connected output assemblies in which a control device for operating a switching device is configured such that the control device subjects the measured value to a test criterion, wherein satisfaction of the test criterion initially noted in the output assembly as a diagnosis fault, and the test criterion is applied cyclically within a time period comprising a waiting time, and wherein another output assembly performs a switch-off test during this time, thus allowing a statement to be made as to whether a wire break is present.

14 Claims, 3 Drawing Sheets

METHOD FOR DIAGNOSING AN ELECTRICAL CONNECTION, AND OUTPUT ASSEMBLY

BACKGROUND OF THE INVENTION

1. Field of the Invention

The invention relates to diagnostics and, more particularly, to a method for diagnosing an electrical connection to a load, where a first voltage for operating the load is produced by a first output of a first output assembly, and a second voltage for operating the load is produced by a second output of a second output assembly, and where in a first step, a test of the electrical connection in the first output assembly is performed through the first output.

The invention furthermore relates to an output assembly having a first output, which is configured to operate a load with a first voltage, having a control device for operating a switching device which switches the first output, and having a measuring device for producing a measured value.

2. Description of the Related Art

Diagnostic methods and assemblies are used, for example, for digital output assemblies, where the diagnosis of the electrical connection preferably amounts to identifying a wire break. Particularly, in the case of safety devices, such as in automation technology, reliable wire break identification plays an important role. On the one hand, safety must be ensured for the process, and on the other hand, safety for life and limb must be ensured, such as for the people involved in the process. Furthermore, in the case of these safety applications, redundant connection of the output assemblies plays a further important role. In the field of automation technology, redundancy means the presence of functionally identical or comparable resources in a technical system when these are not required for fault-free operation, during normal operation. Therefore, at least two systems or two output assemblies are provided to ensure redundant operation.

Based on a redundantly connected system of two conventional automation assemblies, it is known, for example, for the outputs from two digital output assemblies for driving a load to be connected in parallel to the load. Consequently, if one output assembly fails, the current supply for the load is ensured by the other assembly. Here, both output assemblies are equipped with wire break identification. In the situation, in which one of the two assemblies identifies a wire break to the load, the wire break is signaled to the other assembly over a separate communication interface between the redundantly connected output assemblies. This has the disadvantage that additional wiring must be provided for communication between the assemblies. Since the assemblies must also be supplied with an operating voltage, it is also disadvantageous that, in the case of the redundant connection, i.e., in the event of fluctuations in the supply voltages, it is possible for a wire break identification to be diagnosed prematurely, even though no actual wire break has occurred.

SUMMARY OF THE INVENTION

It is therefore an object of the present invention to dispense with additional wiring for communication between two assemblies of redundantly connected output assemblies.

This and other objects and advantages are achieved in accordance with the invention by providing a method for diagnosis of an electrical connection to a load, where a first voltage for operating the load is produced by a first output of a first output assembly, and a second voltage for operating the load is produced by a second output of a second output assembly, in which, a test of the electrical connection using the first output of the first output assembly. In the first output assembly, a current is evaluated in a second step and a measured value obtained from the evaluation is subjected to a test criterion, where satisfaction of the test criterion is first noted in the first output assembly as a diagnosis fault, and then, in a third step, within a time period of a waiting time, the second output assembly is operated such that the second voltage at the second output is switched off for a time period of a switched-off time. In a fourth step, in the first output assembly, the current is re-evaluated and a measured value obtained from the re-evaluated current is once again subjected to the test criterion, where if the test criterion which was satisfied is still satisfied, the first output assembly produces a defect message. In accordance with the method of the invention, the output assemblies are preferably redundantly connected, and in the case of this redundant connection, it is advantageous that, when the first output assembly has identified a supposed diagnosis fault, preferably a wire break identification, this does not immediately lead to a defect message being produced because it could in fact be possible for the identification of the diagnosis fault to have been initiated incorrectly, such as based on voltage fluctuations. In order to reliably verify this initiated fault signal of the diagnosis fault, the second output assembly switches off its voltage to its output for a predetermined time, such that current can no longer flow through the load from this output assembly. For the duration of the switched-off time, the current for the load is provided by the first output assembly. If current still flows, which can be determined by the measuring device, the first assembly can reliably indicate that no wire break has occurred. If current still does not flow during the switched-off time, then the evaluation with the test criterion indicates that this test criterion is still satisfied, and a defect message is therefore produced.

In an advantageous embodiment of the method, if the test criterion is no longer satisfied, the diagnosis fault is canceled. Particularly, in the event of the incorrect initiation of a diagnosis fault, such as due to different load voltages, small load currents, redundant power supply units operating independently of one another or voltage drops on the supply lines to the load, this spurious initiation can be re-tested and if, in fact, there is no wire break, the diagnosis fault for a wire break is cancelled. The process can then continue to operate normally. This method step avoids unnecessary process interruption if a wire break has been erroneously identified.

A further advantage is that the first assembly operates the load during the time period of the switched-off time.

In a further embodiment in which the method is further optimized, within the time period of the waiting time, the measured value obtained from a repeated evaluation of the current is subjected to the test criterion cyclically. If a diagnosis fault is initiated erroneously, then this can be checked a number of times by cyclic testing within the waiting time, and the diagnosis fault can be canceled if the test criterion is no longer satisfied. By way of example, the test criterion can be initiated briefly by electromagnetic (EMC) interference or voltage spikes on the line.

Preferably, the measured value falling below a limit value is used as a test criterion. Here, the measured value is advantageously obtained from a voltage drop across a resistance. In this case, the resistance is connected in the current path of the electrical connection. As long as a current is flowing in the current path to the load, the voltage drop across the resistance is sufficiently great, and can be identified as a measured value and, for example, it is possible to use a comparator to test whether the measured value has the required magnitude, and a limit value has not been undershot.

In one particular embodiment of the method, the test of the electrical connection and the switching-off process are repeated cyclically for the switched-off time period. The cyclic repetition results in the output assemblies having a response which occurs within a predetermined time, i.e., within a given period or duration, an output assembly therefore is repeatedly switched off, and the test criterion is performed with a maximum time period of the waiting time. This predetermined response of the assemblies over time is ideally phase-shifted. Because of the predetermined process, whose timing is known, there is no need to continuously test the test criterion, i.e., to perform wire break monitoring. Accordingly, the first assembly need not be continually "polled" for a wire break. The first assembly virtually knows a time window between the processes of switching the output of the second assembly off, and it is possible to predict that the switching-off process can occur only within a specific range, because the period durations are preferably set to be fixed.

This mutual testing of the output assemblies by the redundantly connected electrical supply lines to the load avoids the need for an additional communication connection between the assemblies.

The object of the invention is also achieved by an output assembly having a first output, which is configured to operate a load with a first voltage, having a control device for operating a switching device which switches the first output, and having a measuring device for producing a measured value, where the control device is configured to subject the measured value to a test criterion, where satisfaction of the test criterion in the output assembly is first noted as a diagnosis fault, the test criterion is applied cyclically within a time period of a waiting time and, if the test criterion is no longer satisfied, before the time period of the waiting time has elapsed, the diagnosis fault is canceled, otherwise a defect message can be produced if the test criterion is still satisfied. In one possible embodiment of the output assembly, the control device comprises, for example, an application specific integrated circuit (ASIC) module or a microcontroller in which the time response for the waiting time and the cyclic application of the test criterion are implemented.

The switching device advantageously includes a first switch and a second switch for connecting a voltage source to the output. Here, the control device is furthermore configured to close the second switch for the time period of the waiting time, and to open the first switch.

In a preferred embodiment, it is possible for the measuring device to have a resistance which is arranged connected in series between the first output and the second switch to determine the measured value.

A first diode is preferably arranged in parallel with the resistance to limit a voltage drop across the resistance. The resistance must be connected in the current paths to test whether there is a diagnosis fault. As a result, a voltage drop is applied across this resistance which is no longer available for the load to be switched. The first diode is advantageously connected in parallel with the resistance to limit the losses.

A deterministic response, i.e., knowledge that future events are unambiguously defined by an initial condition, is preferably achieved in the case of the output assembly in that the control device is configured to switch the switches after a response which is predetermined in time, such that the first voltage at the first output is switched off for a time period of a switched-off time, and such that this switched-off time occurs within a waiting time for the wire-break test.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing illustrates one exemplary embodiment of an output assembly according to the invention, in which.

DETAILED DESCRIPTION OF THE PRESENTLY PREFERRED EMBODIMENTS

Figure 1:
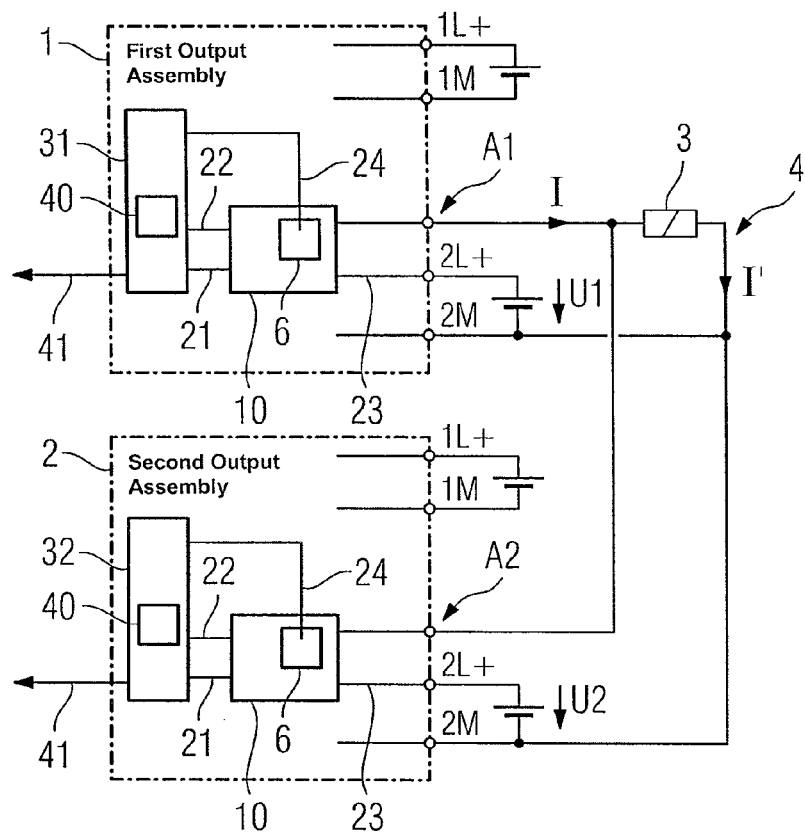
FIG. 1 shows an assembly arrangement of two redundantly connected output assemblies in accordance with the invention.

FIG. 1 shows a schematic block diagram of a first output assembly 1 with a first output A1, and a second output assembly 2 with a second output A2. The outputs A1, A2 of these output assemblies 1, 2 are connected redundantly to a load 3. By way of example, the load 3 may be a relay, an LED, a fire alarm or, in general, a component for a safety application. An electrical connection 4 leads to the load 3, where the electrical connection 4 comprises a connection from the first output A1 to the load 3, a connection from the second output A2 to the load 3, a connection of the first output assembly 1 from a ground connection 2M into the load 3, and a connection from a ground connection 2M of the second output assembly 2. This redundant parallel connection ensures that a current I' can be passed through the load 3 from the respective other output assembly 1, 2 even if one of the output assemblies 1, 2 were to fail.

The output assemblies 1, 2 each have connections for an operating voltage for the output assemblies 1, 2. These operating voltage connections 1L+, 1M are each connected to an operating voltage source. Since the output assemblies 1, 2 are identically configured, the basic internal configuration of the output assemblies 1, 2 will be explained in the following text using the example of the first output assembly 1.

The first output assembly 1 has a switching device 10 for switching the first output A1. The internal configuration of the switching device 10 is described in more detail in FIG. 2. A measuring device 6 for measuring a current I is additionally arranged in the switching device 10. The first output assembly 1 has a first control device 31 for controlling the switching device 10. The first control device 31 is configured to note a diagnosis fault 40 within the first control device 31, and to output a defect message 41 if the diagnosis fault 40 is confirmed. The switching device 10 has a first input 21, a second input 22 and a third input 23. The first input 21 is used to control a first switch 11 (see FIG. 2), the second input 22 is used to control a second switch 12 (see FIG. 2), and the third input 23 is used to connect a first voltage U1, which is connected to the load 3 through the switching device 10 and by the output A1. A current I which flows based on the connected first voltage U1 can flow away from the first output A1 through the load 3 to a ground input 2M of the first assembly and/or to a ground input 2M of the second output assembly 2. This connection represents the redundant connection.

A diagnosis output 24 of the switching device 10 is connected to the first control device 31 and can therefore signal to the first control device 31 whether a diagnosis fault 40 has been identified, which is then noted in the first control device 31. This refinement of the first output assembly 1 allows a method to be performed for detecting a wire break in the electrical connection 4 to the load 3, with the first voltage U1 for operating the load being produced by the first output A1 of the first output assembly 1, and with the second voltage U2 for operating the load being produced by the second output A2 of the second output assembly 2. Here, the electrical connection 4 in the first output assembly 1 is tested by the first output A1, in which case the current I is evaluated in the first output assembly 1 and a measured value obtained from it is subjected to a test criterion, where, satisfaction of the test criterion in the first output assembly 1 is initially noted within the first control device 31 as a diagnosis fault 40, and where the first control device 31 is configured such that, within a time period of a waiting time TW, the measured value obtained from a repeated evaluation of the current I is subjected to the test criterion cyclically.

The second output assembly 2, with its second control device 32, is in this case prepared, for example, by the second control device 32 comprising a microcontroller, such that the microcontroller in the second output assembly 2 operates its corresponding switching device 10 during the cyclically repeating evaluation of the current I in the first output assembly 1. Consequently, the second output assembly 2 is operated within a time period of the waiting time TW such that the second voltage U2 at the second output A2 is switched off for a time period of a switched-off time TA. During this process, the current I in the first output assembly 1 is re-evaluated, and a measured value obtained from this is re-subjected to the test criterion. If the test criterion is still satisfied, then the first output assembly 1 outputs a defect message 41 from its first control device 31.

In other words, if the second voltage U2 is entirely switched off at the second output assembly 2, then a current can still flow only through the first output assembly 1. Thus, if a current is still flowing which is sufficiently large, there can be no wire break and the previously produced diagnosis message 40 can be canceled, and there is no need to produce a defect message 41 for a wire break.

If a wire break were to be present, then no current I would flow through the first output assembly 1 even during the time in which the second output assembly 2 is switched off, and a defect message 41 could be generated.

The disclosed method and contemplated embodiments of the output assemblies 1, 2 have the advantage that a current distribution between the two output assemblies 1, 2 can be different when the load currents are low and/or the supply voltages are different, with the possibility of this leading, for example, to a limit for wire-break identification being undershot in the first output assembly A1, where a corresponding diagnosis will be erroneously output. This erroneously output diagnosis is checked and verified by the disclosed steps of the method in accordance with the invention.

Figure 2:
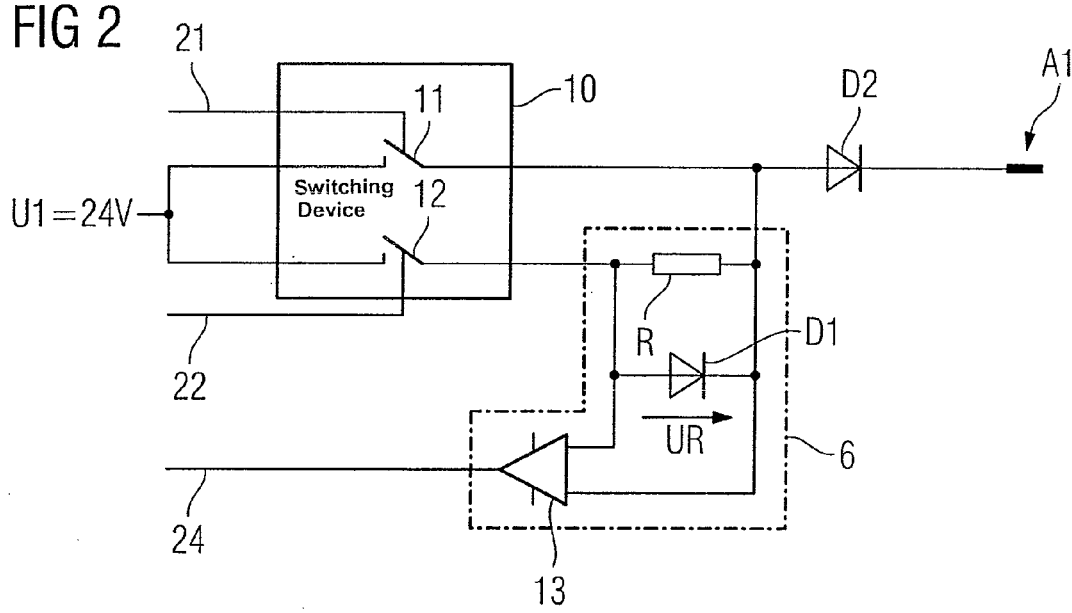
FIG. 2 shows a detailed illustration of the control of an output in accordance with the invention.

The switching device 10 depicted in FIG. 1 is illustrated in FIG. 2, showing the first output A1 and the measurement device 6 in detail. The switching device 10 has a first switch 11 and a second switch 12. The first switch 11 is operated by a first input 21 such that it can change from an open position to a closed position. In the closed position, the first switch 11 passes the first voltage U1, which in the example corresponds to 24 volts, to the output A1. The second switch 12 can correspondingly be operated by a second input 22, such that the second switch 12 also changes from an open position to a closed position, and likewise passes on the first voltage U1. However, a resistance R is now located in the current path to the output A1, connected in series between the second switch 12 and the first output A1. The resistance R is a component of the measuring device 6. If the second switch 12 is closed and the first switch 11 is open, then a voltage UR can therefore also be dropped across the resistance R when a current flows through the output A1 and through the resistance R. The voltage UR is supplied to a comparator 13, which evaluates the voltage UR or the current flowing through the resistance, and subjects current to a test criterion. The test criterion comprises the measured value of the voltage drop UR falling below a limit value which can be established. If the voltage drop UR does not correspond to the previously set limit value, then the comparator 13 is configured to output the diagnosis message 40, as depicted in FIG. 1, by a diagnosis output 24.

In order to decouple the outputs A1, A2 from one another when the output assemblies 1, 2 are redundantly connected, a second diode D2 is arranged in the output path of the first output A1.

Figure 3:
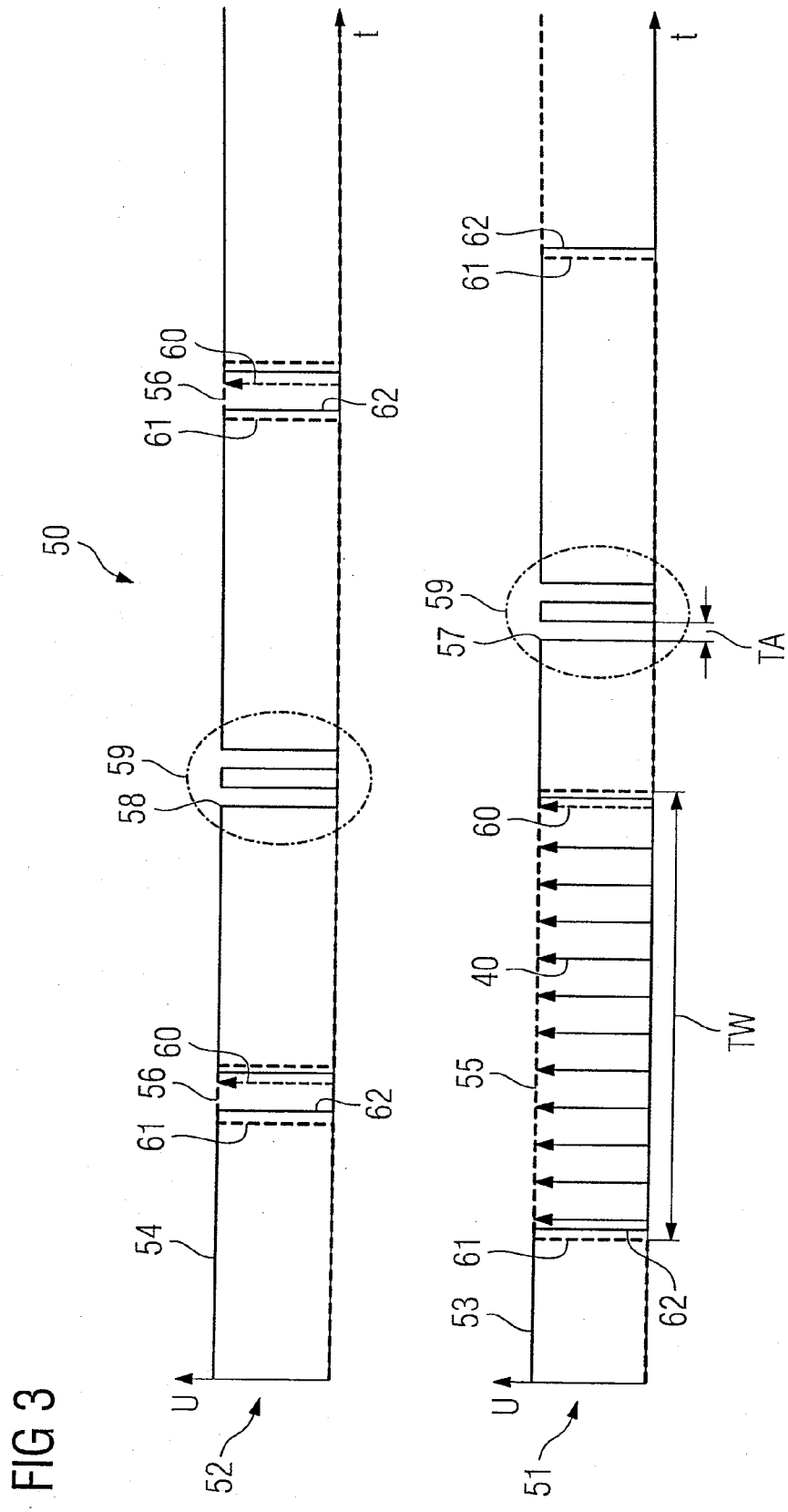
FIG. 3 shows a time response of the redundantly connected output assemblies in accordance with the invention.

FIG. 3 shows a timing diagram 50 for the time profiles of the voltage profile 51 at the first output A1 and of the voltage profile 52 at the second output A2 of the respective output assemblies 1, 2. The profiles are plotted against the time t. The two circled areas 59 each represent a switch-off test. In this switch-off test 59, either the first output A1 or the second output A2 is switched off for the time period of a switched-off time TA.

The profile of the output voltages of the first switch 11 and of the second switch 12 from FIG. 2 in the diagrams is explained in the following test proceeding from left to right in FIG. 3. The voltage profile 51 at the first output A1 has a first area 53 in which the first switch 11 is closed, and in parallel with this the voltage profile 52 at the second output has an area 54 in which the first switch 11 is likewise closed. A rising flank 61 is shown in the first voltage profile 51. This rising flank 61 symbolizes the closing of the second switch 12 for the wire-break test. Shortly after the second switch 12 has been closed, the first switch 11 opens, and this is indicated by a falling flank 62 in the first voltage profile 51. An area 55 denotes the area in which the second switch 12 is still closed, and a wire-break test is performed by the measuring device 6 during this waiting time TW; the diagnosis message 40 is output if the test has a positive result. The eleven solid arrows symbolically represent the cyclic output of the diagnosis message 40. The measured value obtained from a repeated evaluation of the current I is cyclically subjected to the test criterion within the time period of the waiting time TW, and a diagnosis message 40 is output repeatedly.

If the voltage profile 52 at the second output A2 is now considered, it becomes clear that the voltage turns to zero in the circled switch-off test area 59 when the output voltage 58 is switched off. This process of switching off the output voltage 58 still occurs in the area within the time period of the waiting time TW, and the current I is now re-evaluated in the first output assembly 1, as shown in the voltage profile 51 at the first output A1, and the measured value obtained from this is re-subjected to the test criterion since the first output voltage U1 is still present at the first output A1 because the second switch 12 is closed. Consequently, a current can still flow through the load and therefore through the output assembly 1. As a result, if a current is flowing, the diagnosis message 40 has been produced erroneously, because there can be no wire break. A message 60, represented by a dashed arrow, is then output, i.e., the diagnosis is satisfactory. In order to pass on the voltage U1 across the first switch 11, this switch 11 is now closed, and the second switch 12 is opened shortly after this, in order to conclude the wire-break test. A voltage is now produced in the first voltage profile 51, which is applied to the first output A1 exclusively by the first switch 11. The output voltage U1 is now switched off 57 for the time period TA in the switch-off test area 59 in the first voltage profile 51.

The test of the electrical connection 4, i.e., the second switch 12 being switched on for at most the time period of the waiting time TW and being switched off for the time period of the switched-off time TA, is repeated cyclically in the first voltage profile 51 and, in this case, the test for the wire-break test and the process of switching the output voltage off are likewise repeated cyclically in the second voltage profile 52. The two output assemblies 1, 2 are therefore alternately tested by respective cyclic repetitions of the wire-break test with the time period of the waiting time TW, and the switch-off test 59 with the switched-off time period TA.

In the second voltage profile 52, the area 56 represents the area in which the second switch 12 is closed which, in this case represents the situation in which, with the rising flank 61 and after the falling flank 62, the voltage produced at the second output A2 is produced solely by the second switch 12 at the second output A2, and a wire-break test can therefore also be performed in the second assembly A2. However, a wire break cannot be identified in this case. As a result, the message 60 meaning diagnosis satisfaction can be output immediately and, when the message 60 has been output, it is possible once again to switch over from the wire-break test, i.e., with the second switch 12 being closed and the first switch 11 open, to normal operation, i.e., with the first switch 11 being closed, and the second switch 12 open.

Figure 4:
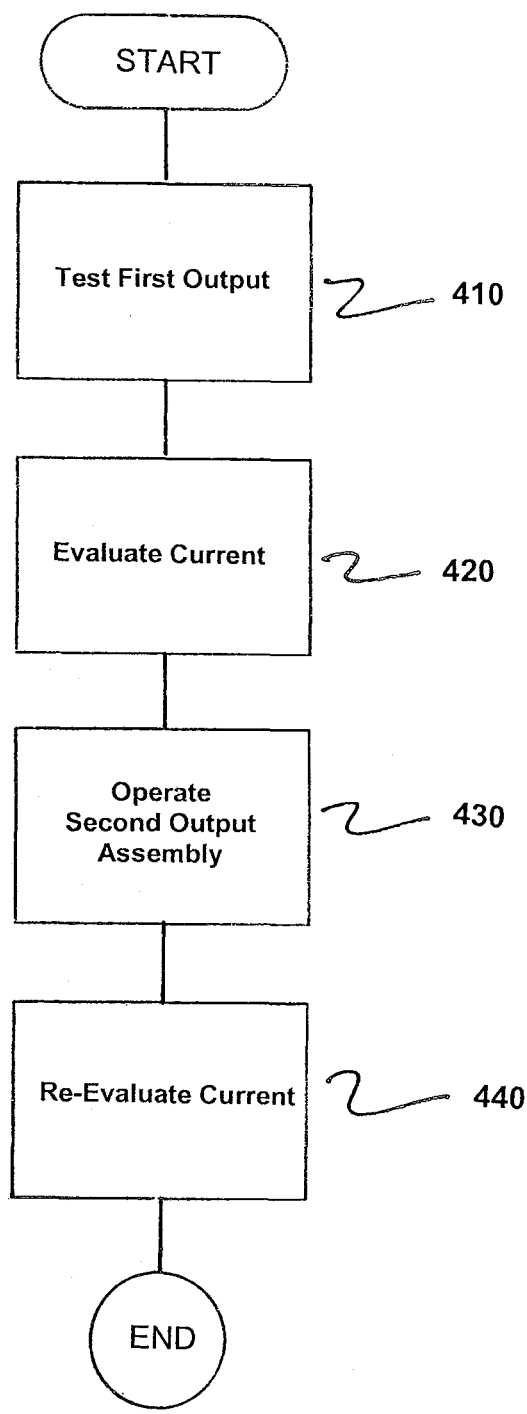
FIG. 4 is a flow chart of the method in accordance with an embodiment of the invention.

FIG. 4 is a flow chart of a method for diagnosis of an electrical connection to a load, a first voltage for operating the load being produced by a first output of a first output assembly, and a second voltage for operating the load being produced by a second output of a second output assembly. The method comprises performing, in the first output assembly, a test of the electrical connection at the first output, as indicated in step 410.

A current is evaluated in the first output assembly, as indicated in step 420. Here, a measured value obtained from the evaluated current is subjected to a test criterion, where satisfaction of the test criterion being initially noted in the first output assembly as a diagnosis fault.

The second output assembly is operated within a time period comprising a waiting time such that the second voltage at the second output is switched off for a time period comprising a switched-off time, as indicated in step 430.

The current in the first output assembly is re-evaluated, as indicated in step 440. Here, the measured valued obtained from the re-evaluation of the current is re-subjected to the test criterion, where if the test criterion which was satisfied is still satisfied, the first output assembly producing a defect message.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for diagnosis of an electrical connection to a load, a first voltage for operating the load being produced by a first output of a first output assembly, and a second voltage for operating the load being produced by a second output of a second output assembly, the method comprising:
   (i) performing, in the first output assembly, a test of the electrical connection using the first output;
   (ii) evaluating, in the first output assembly, a current by measuring value obtained from the evaluated current and subjecting the measured value to a test criterion, satisfaction of the test criterion being initially noted in the first output assembly as a diagnosis fault;
   (iii) operating the second output assembly within a time period comprising a waiting time such that the voltage at the second output is switched off for a time period comprising a switched-off time; and
   (iv) re-evaluating, in the first output assembly, the current, by measuring the value obtained from the re-evaluated current by subjecting the measured value to the test criterion, if the test criterion which was satisfied is still satisfied, then the first output assembly producing a defect message.

2. The method as claimed in claim 1, wherein, if the test criterion is no longer satisfied in the step of re-evaluating, the diagnosis fault is canceled.

3. The method as claimed in claim 2, wherein the first output assembly operates the load during the time period comprising the switched-off time of the second output.

4. The method as claimed in claim 1, wherein the first output assembly operates the load during the time period comprising the switched-off time of the second output.

5. The method as claimed in claim 1, wherein the measured value is obtained from the evaluation of the current and is subjected to the test criterion cyclically within the time period comprising the waiting time.

6. The method as claimed in claim 1, wherein a measured value falling below a limit value is used as the test criterion.

7. The method as claimed in claim 1, wherein the measured value is obtained from a voltage drop across a resistance which is connected in a current path of the electrical connection.

8. The method as claimed in claim 1, wherein the test of the electrical connection and the switching-off process are repeated cyclically for the time period comprising the switched-off time.

9. The method as claimed in claim 1, wherein the test of the electrical connection and the switching-off for the time period comprising the switched-off time are performed alternately by the first output assembly and by the second output assembly.

10. An output assembly having a first output configured to operate a load with a first voltage, comprising:
   a switching device for switching the first output;
   a measuring device for producing a measured value; and
   a control device configured to operate the switching device to switch the first output and configured to subject the measured value to a test criterion; and wherein satisfaction of the test criterion is initially noted in the control device of the output assembly as a diagnosis fault, the control device cyclically obtains the measured value and subjects the measured value to the test criterion within a time period comprising a waiting time; and wherein the control device is configured to cancel the diagnosis fault if the test criterion is no longer satisfied, before the time period comprising the waiting time has elapsed, produce a defect message if the test criterion is still satisfied after the waiting time has elapsed.

11. The output assembly as claimed in claim 10, wherein the switching device has a first switch and a second switch for connection of a voltage source to the first output, and the control device is further configured to close the second switch for the time period comprising the waiting time, and to open the first switch.

12. The output assembly as claimed in claim 11, wherein the measuring device includes a resistor connected in series between the first output and the second switch.

13. The output assembly as claimed in claim 12, wherein the measuring device includes a first diode is arranged in parallel with the resistor to limit a voltage drop across the resistor.

14. The output assembly as claimed in claim 11, wherein the control device is configured to switch the first and second switches after a response during a predetermined time such that the first voltage at the first output is switched off for a time period comprising a switched-off time.

* * * * *